(12) United States Patent
Drynan et al.

(10) Patent No.: US 6,645,846 B2
(45) Date of Patent: Nov. 11, 2003

(54) METHODS OF FORMING CONDUCTIVE CONTACTS TO CONDUCTIVE STRUCTURES

(75) Inventors: John M. Drynan, Boise, ID (US); Thomas A. Figura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/999,513

(22) Filed: Oct. 24, 2001

(65) Prior Publication Data

US 2003/0074787 A1 Apr. 24, 2003

(51) Int. Cl.[7] .......................................... H01L 21/4763
(52) U.S. Cl. .................... 438/622; 438/210; 438/233; 438/625; 438/634; 438/637; 438/666; 438/672
(58) Field of Search ................................. 438/210, 233, 438/239, 256, 399, 622, 625, 629, 633–634, 637, 639, 666, 672, 675

(56) References Cited

U.S. PATENT DOCUMENTS

| | | | | |
|---|---|---|---|---|
| 6,080,621 A | * | 6/2000 | Wang et al. | 438/239 |
| 6,168,989 B1 | * | 1/2001 | Chiang et al. | 438/634 |
| 6,194,313 B1 | * | 2/2001 | Singh et al. | 438/675 |
| 6,239,022 B1 | * | 5/2001 | Seo et al. | 438/629 |
| 6,380,042 B1 | * | 4/2002 | Huang | 438/666 |
| 2002/0110975 A1 | * | 8/2002 | Parekh et al. | 438/239 |

* cited by examiner

*Primary Examiner*—John F. Niebling
*Assistant Examiner*—Lynne A. Gurley
(74) *Attorney, Agent, or Firm*—Wells St. John P.S.

(57) ABSTRACT

A method of forming a conductive contact to a conductive structure includes forming a conductive structure received within and projecting outwardly from a first insulative material. A second different insulative material is deposited. The second insulative material is anisotropically etched effective to form a sidewall etch stop for the conductive structure. A third insulative material is deposited over the conductive structure and the sidewall etch stop. The third insulative material is different in composition from the second insulative material. A contact opening is etched through the third insulative material to the conductive structure using an etch chemistry which is substantially selective to the second insulative material of the sidewall etch stop. Integrated circuitry independent of the method of fabrication is disclosed.

42 Claims, 7 Drawing Sheets

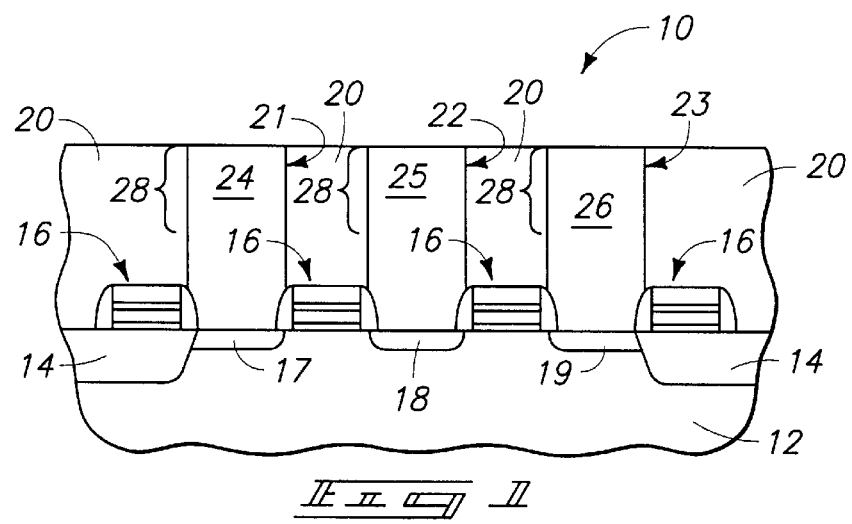
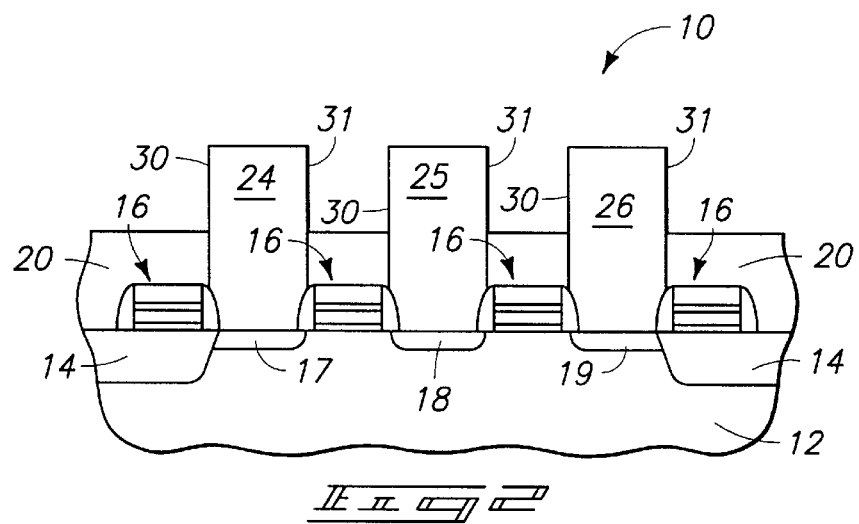
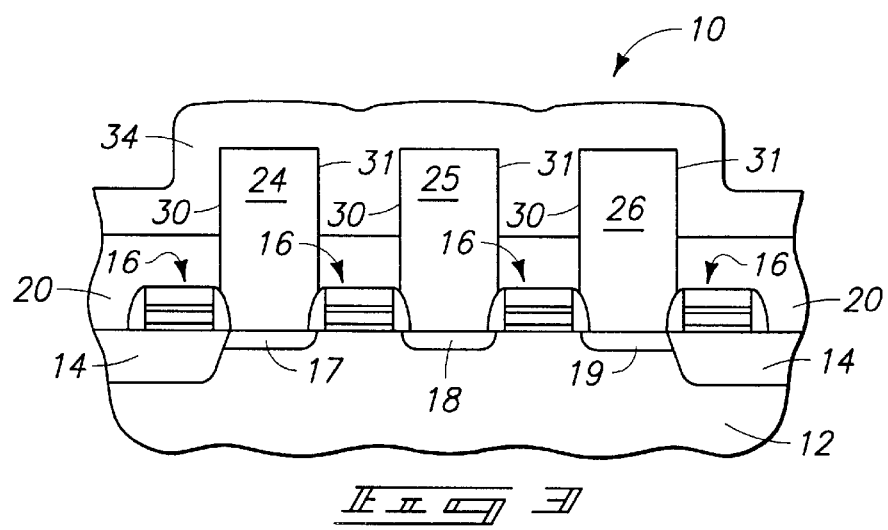

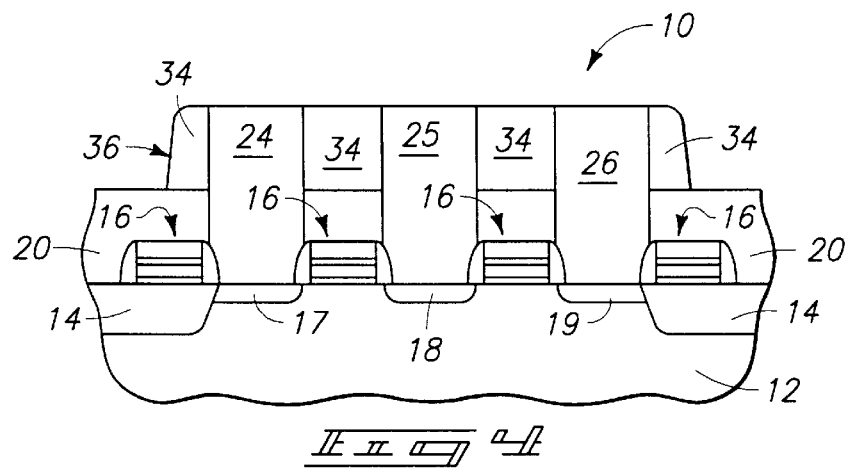
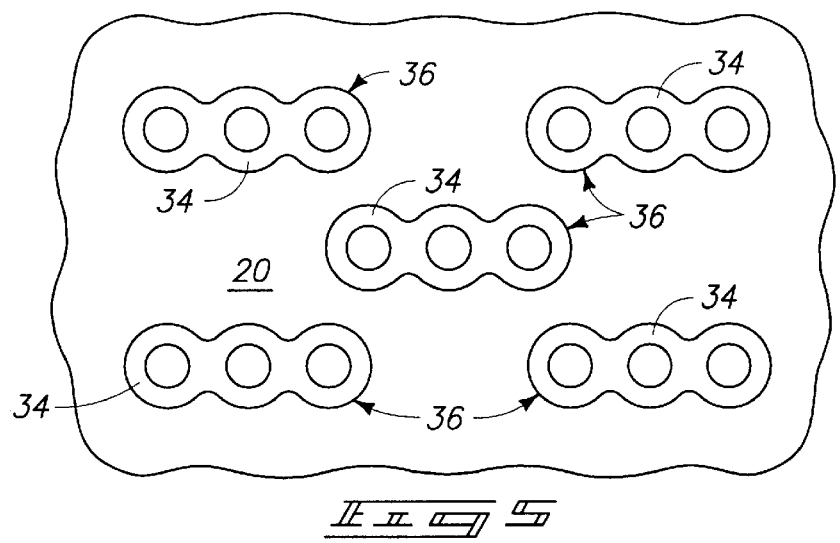
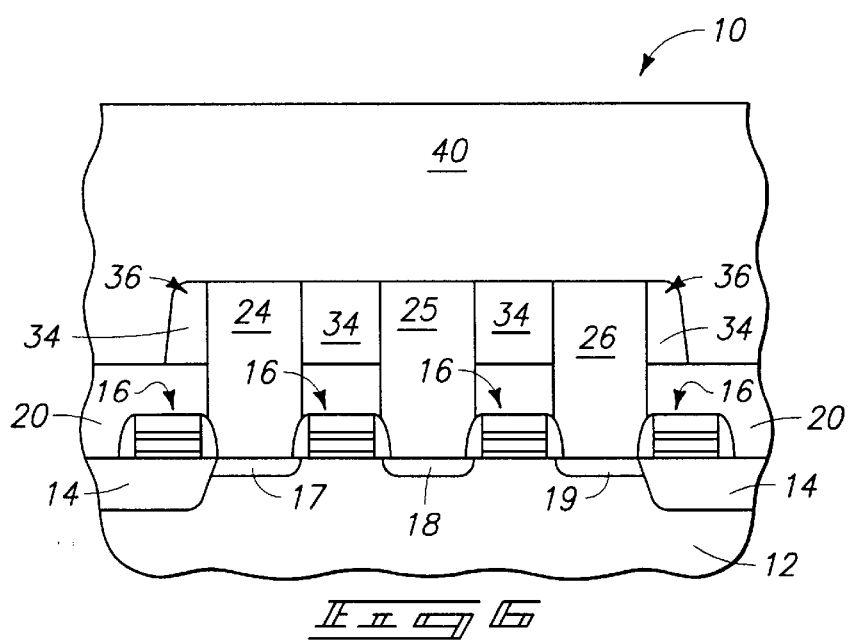

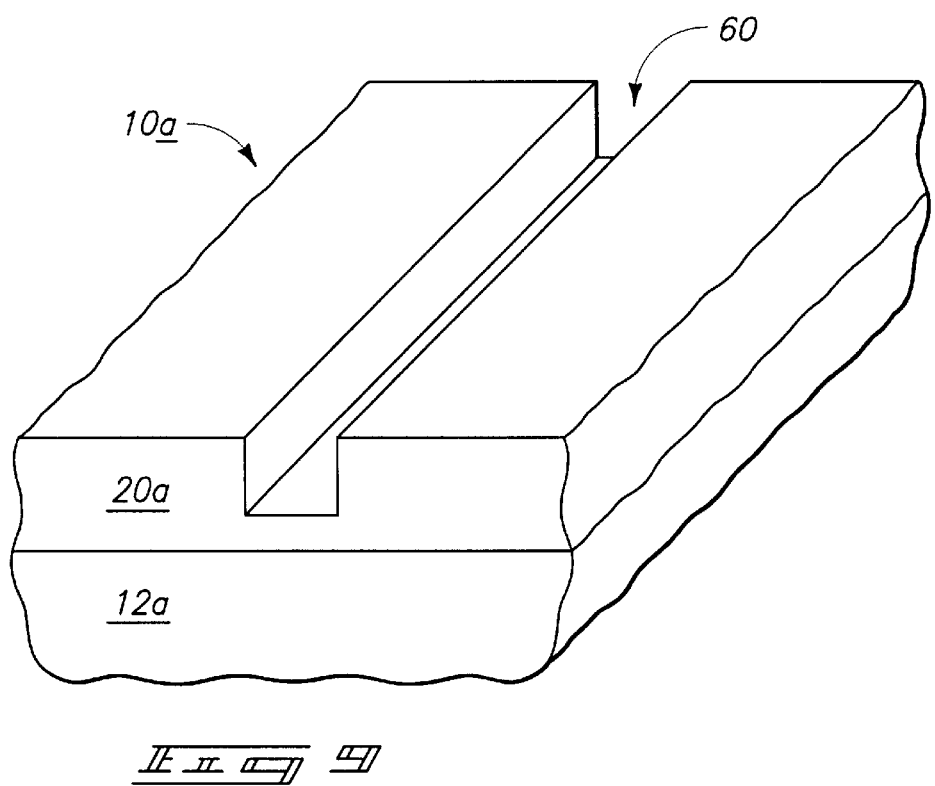
_Fig. 9_
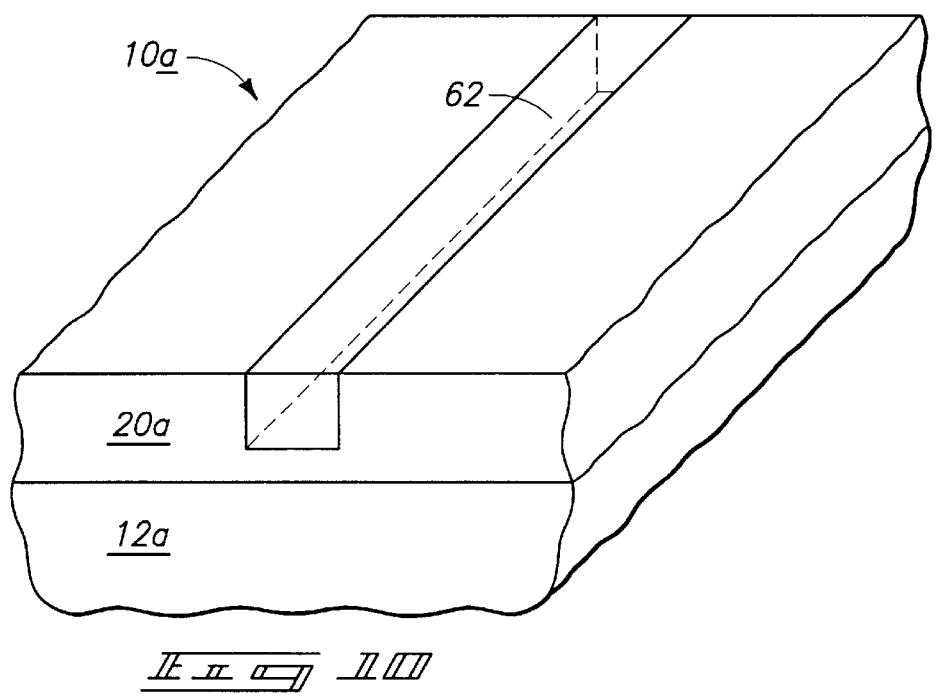
_Fig. 10_

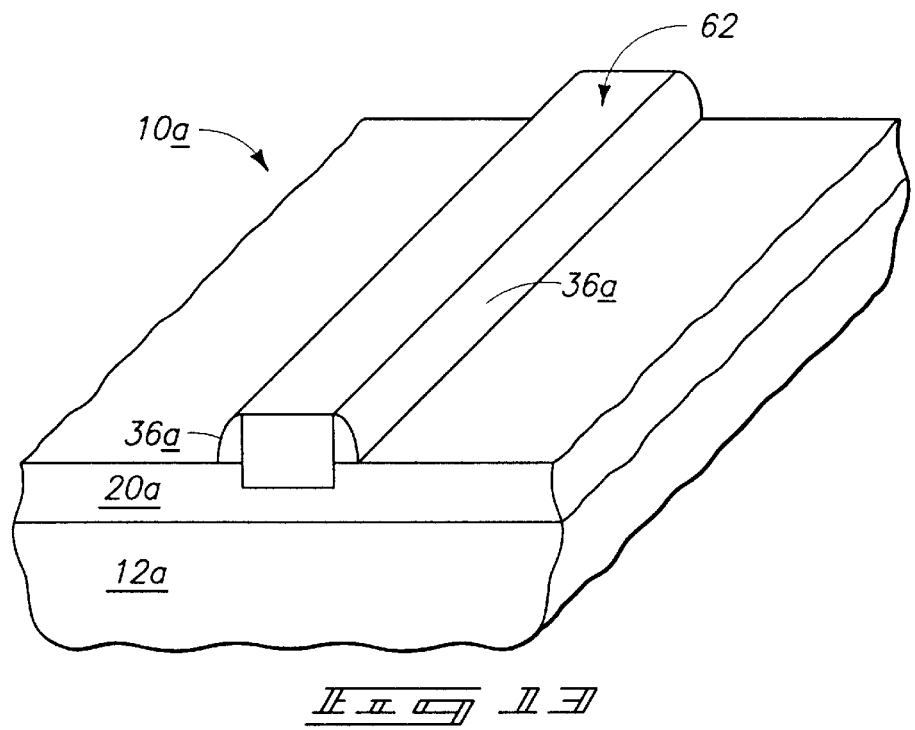
_Fig 13_
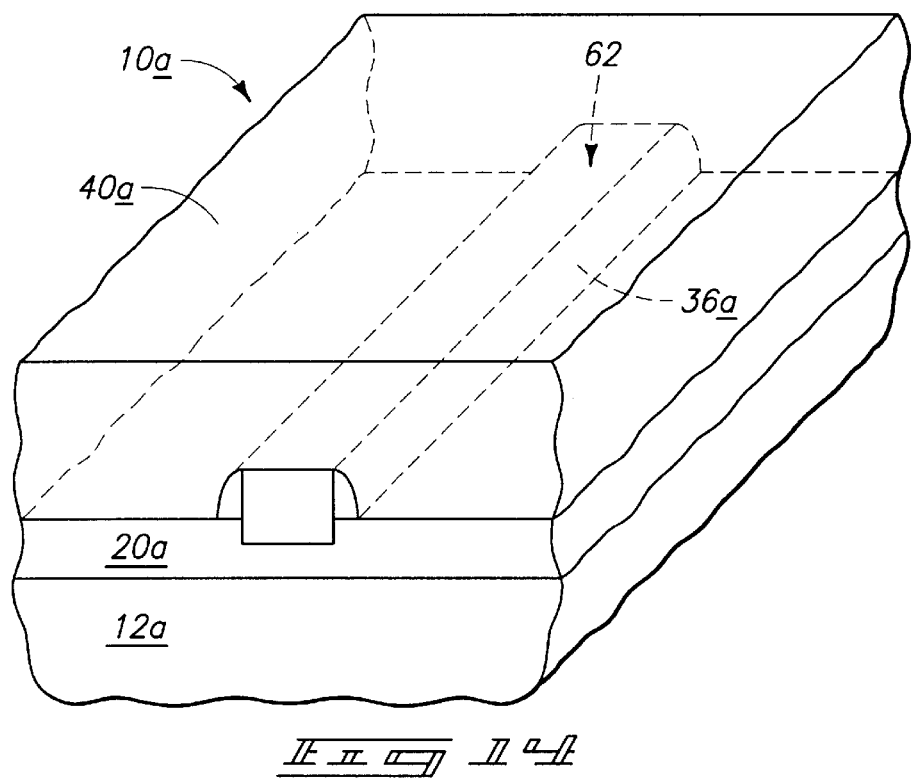
_Fig 14_

METHODS OF FORMING CONDUCTIVE CONTACTS TO CONDUCTIVE STRUCTURES

TECHNICAL FIELD

This invention relates to methods of forming conductive contacts to conductive structures, and to integrated circuitry.

BACKGROUND OF THE INVENTION

Semiconductor wafer processing in the fabrication of integrated circuitry typically includes the formation of contact openings within insulating layers to underlying conductive structures. Currently, such processing is typically conducted by photolithography wherein a masking layer is deposited and a desired pattern of openings is formed therethrough. The masking layer is then used as a mask while chemical etching is conducted through the mask openings into the underlying insulative material to etch it largely selective to the masking layer such that the openings can be extended through the insulating material to the conductive structures therebeneath.

The intent, of course, is to very precisely align the reticle or other device used to form the desired opening patterns within the masking layer. If the openings are misaligned, the openings to be etched within the insulating layer(s) might include portions which extend laterally beyond the desired boundary of the conductive structure to which the openings are being etched. This can undesirably lead to etching of insulating material laterally of the conductive structure and sometimes lead to undesired exposure of other conductive structures. When the contact openings are filled with conductive material, this can of course lead to fatal shorts in the circuitry.

One prior art method of minimizing or attempting to prevent this tendency is to provide a thin blanket etch stop layer over the conductive structure prior to providing a thicker insulative material layer through which the primary contacts are intended to be made to the conductive structures. However, another masking step is typically utilized to make contact openings within the etch stop layer prior to provision of the thicker insulative layer thereover. The typical thin nature of the blanket deposited and photopatterned etch stop layer is such that a chemistry can typically be selected to etch the etch stop layer largely selective relative to the underlying conductive material and other insulative material beneath the etch stop layer. Subsequently, the etch stop layer will provide a degree of protection for mis-aligned contact openings being etched into the overlying insulative layer.

The following invention was motivated in addressing the above identified problems, although such is in no way so limited. The invention is limited only by the accompanying claims as literally worded without limiting reference to the specification, and in accordance with the doctrine of equivalence.

SUMMARY

The invention includes methods of forming conductive contacts to conductive structures, and to integrated circuitry. In one implementation, a method of forming a conductive contact to a conductive structure includes forming a conductive structure received within and projecting outwardly from a first insulative material. A second insulative material is deposited over the conductive structure. The second insulative material is different in composition from the first insulative material. The second insulative material is anisotropically etched effective to form a sidewall etch stop for the conductive structure. A third insulative material is deposited over the conductive structure and the sidewall etch stop. The third insulative material is different in composition from the second insulative material. A contact opening is etched through the third insulative material to the conductive structure using an etch chemistry which is substantially selective to the second insulative material of the sidewall etch stop.

In one implementation, integrated circuitry includes a plurality of conductive structures received within and projecting outwardly from a first insulative material. A plurality of isolated insulative collars is received about the conductive structures and over the first insulative material. The insulative collars comprise a material different from the first insulative material. A third insulative material is received over the conductive structures and insulative collars. The third insulative material is different from the collar material. A plurality of conductive contacts are formed to the conductive structures through the third insulative material.

In one implementation, integrated circuitry includes a conductive line received within and projecting outwardly from a first insulative material. The conductive line includes opposing sidewall portions which project outwardly from the first insulative material. A pair of insulative sidewall spacers is received over the sidewall portions and over the first insulative material. The sidewall spacers comprise a material different from the first insulative material. A third insulative material is received over the conductive line and the sidewall spacers. The third insulative material is different from the sidewall spacer material. A conductive contact is formed to the conductive line through the third insulative material.

BRIEF DESCRIPTION OF THE DRAWINGS

Preferred embodiments of the invention are described below with reference to the following accompanying drawings.

FIG. 1 is a diagrammatic perspective view of a semiconductor wafer fragment/section in process in accordance with an aspect of the invention.

FIG. 2 is a view of the FIG. 1 wafer fragment at a processing step subsequent to that shown by FIG. 1.

FIG. 3 is a view of the FIG. 2 wafer fragment at a processing step subsequent to that shown by FIG. 2.

FIG. 4 is a view of the FIG. 3 wafer fragment at a processing step subsequent to that shown by FIG. 3.

FIG. 5 is a top plan view of a larger portion of the wafer fragment in process, and corresponding in sequence to the processing of FIG. 4.

FIG. 6 is a view of the FIG. 4 wafer fragment at a processing step subsequent to that shown by FIG. 4.

FIGS. 9 and 10 are a diagrammatic perspective view of another semiconductor wafer fragment/section in process in accordance with an aspect of the invention.

FIG. 13 is a view of the FIG. 12 wafer fragment at a processing step subsequent to that shown by FIG. 12.

FIG. 14 is a view of the FIG. 13 wafer fragment at a processing step subsequent to that shown by FIG. 13.

DETAILED DESCRIPTION OF THE PREFERRED EMBODIMENTS

Figure 7:
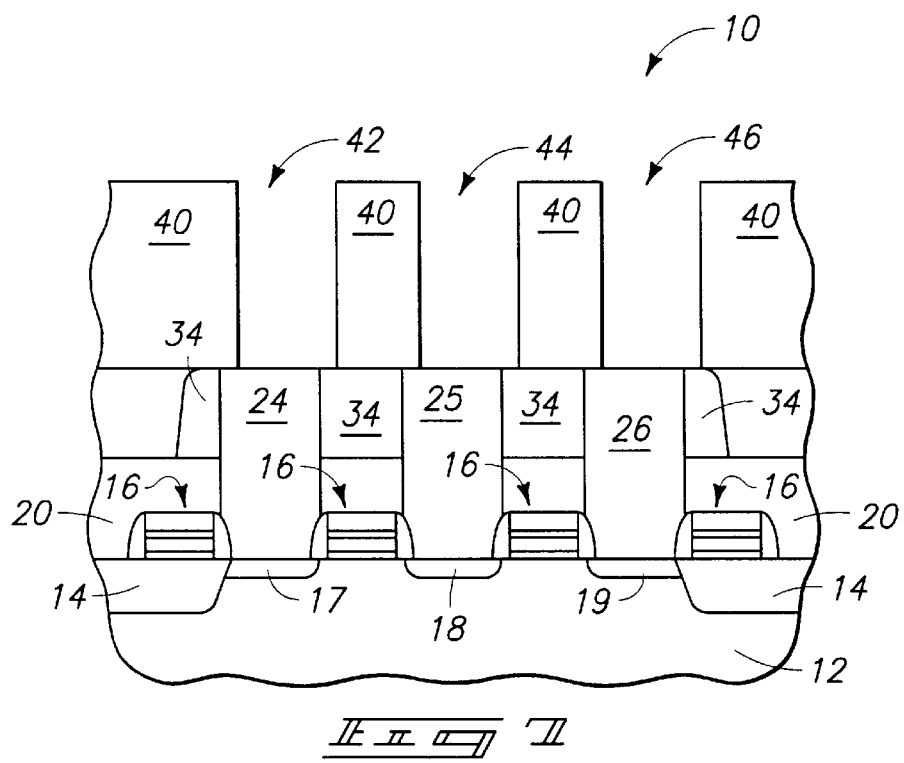
FIG. 7 is a view of the FIG. 6 wafer fragment at a processing step subsequent to that shown by FIG. 6.

This disclosure of the invention is submitted in furtherance of the constitutional purposes of the U.S. Patent Laws "to promote the progress of science and useful arts" (Article 1, Section 8).

One first preferred embodiment of a method of forming a conductive contact to a conductive structure, and integrated circuitry independent of the method of fabrication, is described with reference to FIGS. 1–8. FIG. 1 depicts a semiconductor wafer fragment 10 comprising of bulk monocrystalline substrate 12 having trench isolation regions 14 form therein. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the terms "layer" and "material" encompass both the singular and the plural unless otherwise indicated.

FIG. 1 depicts partial fabrication of exemplary DRAM circuitry, with the depicted cross section showing a pair of DRAM memory cells. An exemplary material for substrate 12 is bulk monocrystalline silicon. A series of four wordlines 16 are shown formed over substrate 12/14. A series of diffusion regions 17, 18 and 19 are received within substrate 12 between isolation regions 14 and wordlines 16. Diffusion regions 17, 19, or source/drain regions 17, 19, will connect with storage nodes of storage capacitors, while diffusion region 18 will connect with a bit line.

A first insulative material 20 is deposited over the substrate, and is planarized. Material 20 may be homogenous, or comprise a plurality of different materials or layers. An exemplary preferred primary composition for material 20 is borophosphosilicate glass (BPSG). Contact openings 21, 22 and 23 have been formed through first insulative material 20 to proximate diffusion region 17, 18, 19, respectively. Such have been filled with conductive material to form a plurality of conductive structures 24, 25 and 26. An exemplary height/elevation above the diffusion regions for structures 24, 25 and 26 is from 1,000 Angstroms to 10,000 Angstroms. Such in the preferred embodiment accordingly project outwardly from diffusion region 17, 18, 19, respectively. Material or materials to form structures 24, 25 and 26 comprise one or more metals, metal compounds, conductively doped semiconductive materials, and mixtures thereof. The preferred embodiment implementation of FIG. 1 depicts projections 24, 25 and 26 in the form of upstanding pillars. Such provides but one exemplary embodiment in forming a conductive structure which projects outwardly relative to some underlying substrate. Pillars 24, 25 and 26 can be considered as having some outer region 28 the lateral portions of which are surrounded by first insulative material 20. In the illustrated and preferred embodiment, first insulative material 20 contacts projections 24, 25 and 26, and outer portions 28. Such provides but one exemplary embodiment of providing first insulative material proximate a conductive structure and over underlying substrate.

Referring to FIG. 2, a portion of first insulative material 20 is removed effective to expose respective opposing sidewall portions 30, 31 of the respective conductive structures, and leave the conductive structures 24, 25 and 26 projecting outwardly from first insulative material 20. The removing is preferable conducted by chemical etching. Such provides but one example of forming one or more conductive structures received within and projecting outwardly from a first insulative material. An exemplary preferred etching will leave from 500 Angstroms to 5,000 Angstroms (about 2,000 Angstroms being more preferred) of structures 24, 25 and 26 exposed above material 20.

Referring to FIG. 3, a second insulative material 34 is deposited over first insulative material 20 and conductive structures 24, 25, and 26 projecting outwardly therefrom. Second insulative material is different in composition from first insulative material 20. Where first insulative material 20 principally comprises an oxide such as BPSG, an exemplary preferred composition for material 34 is an insulative nitride, for example silicon nitride. An exemplary preferred deposition thickness range for layer 34 is from 100 Angstroms to 2,000 Angstroms. Preferably as shown, second insulative material 34 contacts conductive sidewall portions 30/31.

Referring to FIGS. 4 and 5, second insulative material 34 is anisotropically etched to form a sidewall etch stop 36 for the individual conductive structures. Any suitable chemistry, whether existing or yet-to-be-developed can be used. For example to etch silicon oxide or silicon nitride in a dry etch, one or more of a fluorocarbon or hydrofluorocarbon primary gas along with one or more secondary gases such as oxygen, nitrogen, or argon can be used. In the illustrated and preferred embodiment where the conductive structure is a pillar, the anisotropic etching preferably forms the sidewall etch stop 36 in the form of a series of interconnected collars which are received about the respective conductive pillars. FIG. 5 depicts a larger portion of the semiconductor wafer fragment in top perspective view showing a plurality of isolated etch stop collars 36 which are received about the conductive structures, which in this preferred embodiment constitute conductive pillars. As shown, at least some of the isolated etch stop collars 36 are formed to collar multiple conductive structures which project outwardly from first insulative material 20. The anisotropic etching of layer 34 is preferable conducted without providing any masking over any of substrate 10 during such etching.

Referring to FIG. 6, a third insulative material 40 is formed over conductive structures 24, 25 and 26 and sidewall etch stops 36. Third insulative material 40 is different in composition from second insulative material 34. First insulative material 20 and third insulative material 40 may be of the same composition, or may not be of the same composition. Further by way of example only, both may comprise the same or different oxides. One preferred embodiment forms second insulative material 34 to comprise an insulative nitride, and insulative materials 20 and 40 to comprise the same or different oxides. One specific preferred embodiment is to form layers 20 and 40 to comprise BPSG, and material 34 to comprise silicon nitride.

Referring to FIG. 7, contact openings 42, 44 and 46 are etched through third insulative material 40 to conductive structures 24, 25 and 26, respectively, using an etch chemistry which is substantially selective to second insulative material 34 of sidewall etch stops 36. In the context of this document, "substantially selective" means an etch ratio of one material to another of at least 2:1. The depicted processing shows openings 42, 44 and 46 being slightly misaligned to the right whereby such etching does ultimately expose sidewall etch stop 36.

Figure 8:
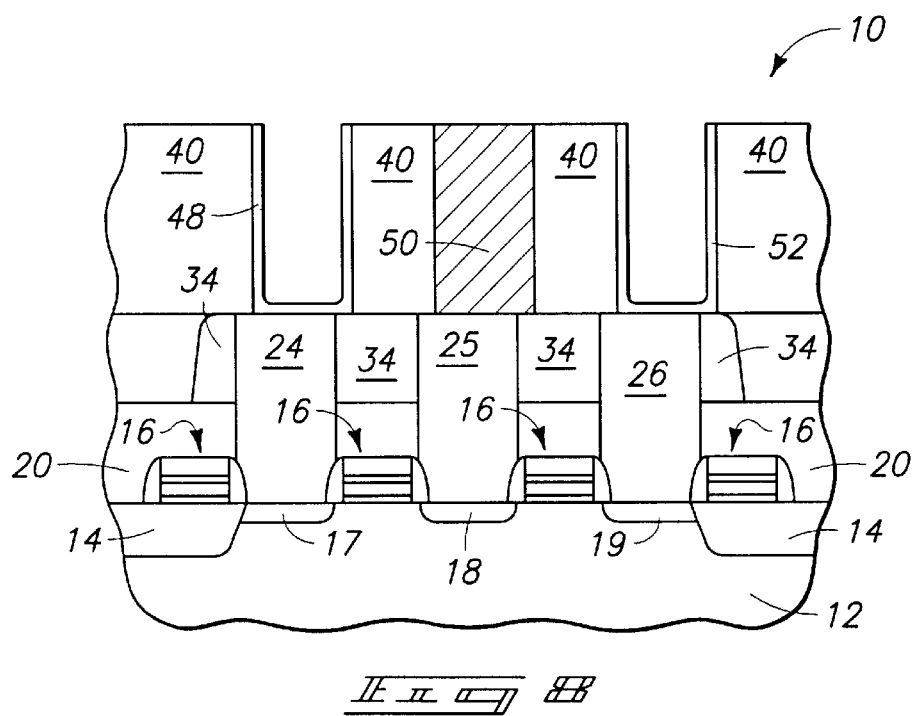
FIG. 8 is a view of the FIG. 7 wafer fragment at a processing step subsequent to that shown by FIG. 7.

Referring to FIG. 8, contact openings 42, 44 and 46 are at least partially filled with conductive material, thereby forming conductive contacts 48, 50 and 52 to conductive structures 24, 25 and 26 through third insulative material 40. In the depicted and preferred embodiments, contacts 48 and 52 constitute storage node capacitor plates, while contact 50 constitutes a plugging material for ultimate connection with a bit line in the depicted DRAM circuitry. Any existing or yet-to-be-developed processing(s) can be conducted to complete the circuitry fabrication.

But one additional alternative embodiment of many is next described with reference to FIGS. 9–16. Like numerals from the first described embodiment are utilized where appropriate, with differences being indicated with a suffix "a" or with different numerals. FIG. 9 depicts a semiconductor wafer fragment 10a having a first insulative material 20a formed over a bulk substrate 12a. A trough 60 has been formed in first insulative material 20a into some desired conductive line shape.

Referring to FIG. 10, trough 60 has been at least partially filled with conductive material 62 effective to form a conductive line within trough 60. Any conductive metal, metal compound, alloy or conductively doped semiconductive material, or mixtures thereof, might be utilized.

Figure 11:
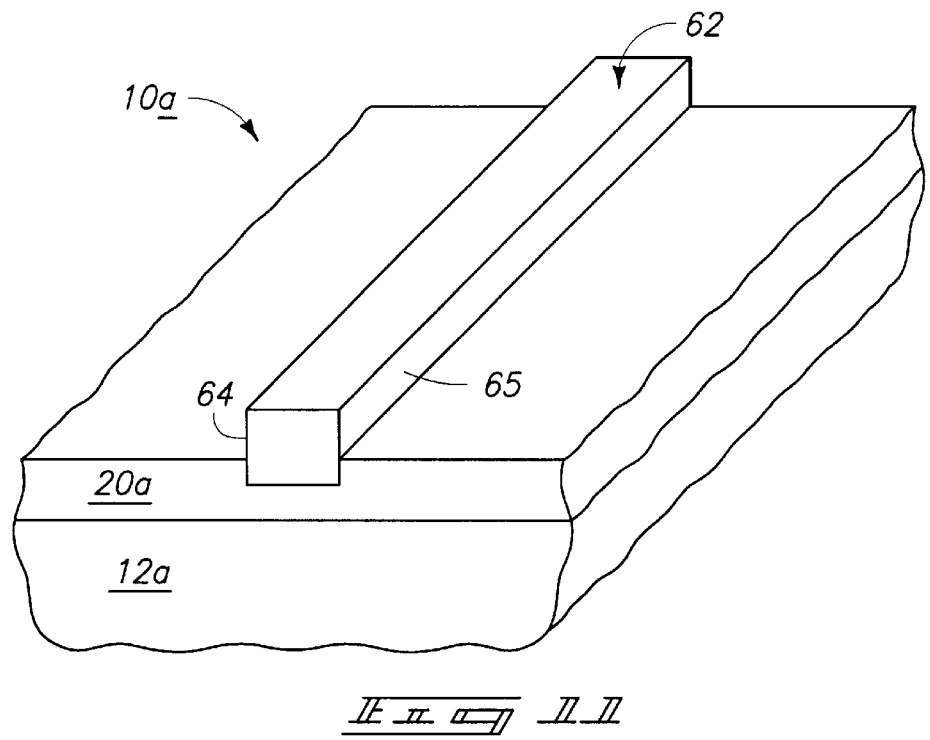
FIG. 11 is a view of the FIG. 10 wafer fragment at a processing step subsequent to that shown by FIG. 10.

Referring to FIG. 11, only some of first insulative material 20a is removed, preferably by chemical etching, effective to expose sidewall portions 64, 65 of conductive line 62. Again, such provides but one example of forming a conductive structure received within and projecting outwardly from a first insulative material, with the conductive structure here being in the form of a conductive line.

Figure 12:
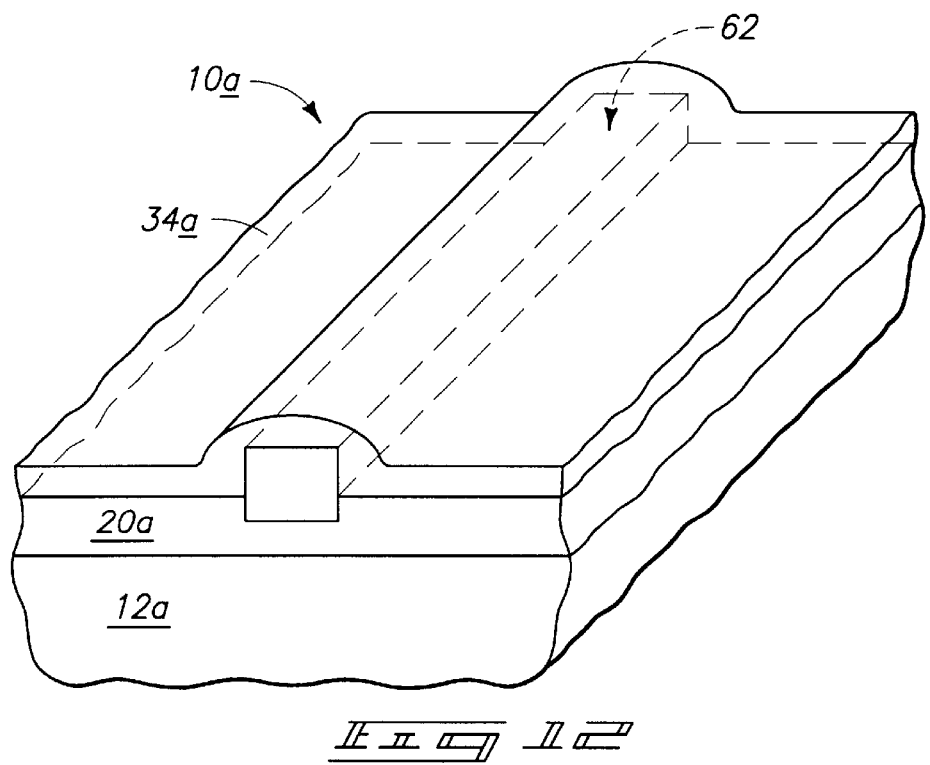
FIG. 12 is a view of the FIG. 11 wafer fragment at a processing step subsequent to that shown by FIG. 11.

Referring to FIG. 12, a second insulative material 34a is deposited over conductive line 62, exposed sidewall portion 64, 65 thereof, and first insulative material 20a. Second insulative material 34a is different in composition from first insulative material 20a. Exemplary materials and relationships are as those described above with respect to materials 20 and 34. Preferably, second insulative material 34a contacts exposed sidewall portions 64 and 65.

Referring to FIG. 13, second insulative material 34a is anisotropically etched effective to form sidewall etch stop spacers 36a over sidewall portions of insulative line 62 and over first insulative material 20a.

Referring to FIG. 14, a third insulative material 40a is deposited over conductive line 62 and sidewall etch stop spacers 36a. Third insulative material 40a is different in composition from second insulative material 34a. Exemplary preferred materials and relationships relative to third insulative material 40a are as described above with respect to material 40.

Figure 15:
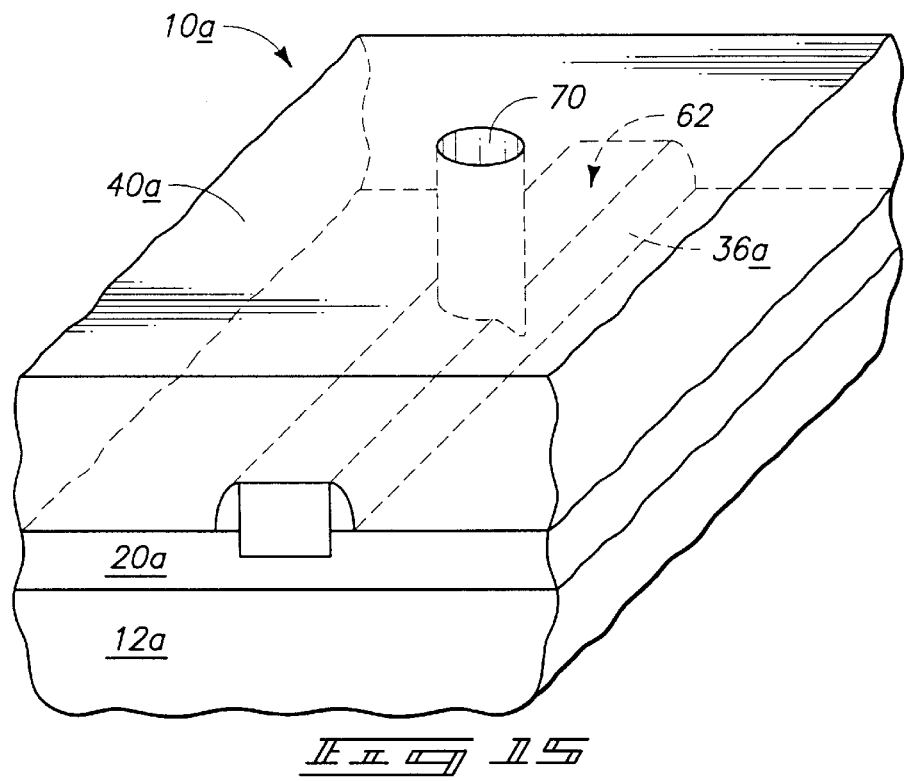
FIG. 15 is a view of the FIG. 14 wafer fragment at a processing step subsequent to that shown by FIG. 14.

Referring to FIG. 15, a contact opening 70 is etched through third insulative material 40a to conductive line 62 using an etch chemistry which is substantially selective to second insulative material 34a of sidewall etch stop spacer 36a. Contact opening 70 is shown being slightly misaligned such that the etching of its formation ultimately exposes one of etch stop spacers 36a.

Figure 16:
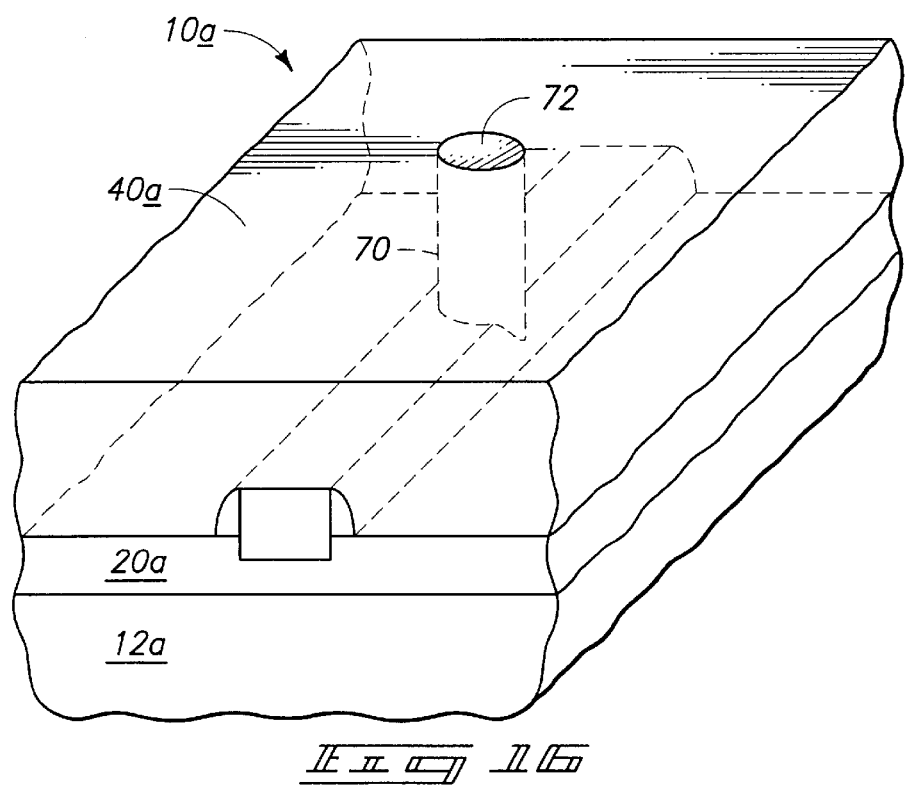
FIG. 16 is a view of the FIG. 15 wafer fragment at a processing step subsequent to that shown by FIG. 15.

Referring to FIG. 16, conductive material 72 is formed within contact opening 70, thereby in the illustrated embodiment forming a conductive contact to conductive line 62 through third insulative material 40a.

The invention also contemplates integrated circuitry independent of the method of fabrication.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive contact to a conductive structure, comprising:

forming a conductive structure received within and projecting outwardly from a first insulative material, conductive material of the conductive structure being received within and projecting outwardly from the first insulative material;

depositing a second insulative material over the conductive structure, the second insulative material being different in composition from the first insulative material;

anisotropically etching the second insulative material effective to form a sidewall etch stop over a sidewall of the conductive material of the conductive structure;

depositing a third insulative material over the conductive structure and the sidewall etch stop, the third insulative material being different in composition from the second insulative material; and etching a contact opening through the third insulative material to the conductive material of the conductive structure using an etch chemistry which is substantially selective to the second insulative material of the sidewall etch stop.

2. The method of claim 1 wherein the first and third insulative materials are of the same composition.

3. The method of claim 1 wherein the first and third insulative materials are not of the same composition.

4. The method of claim 1 wherein the second insulative material comprises a nitride, and the first and third insulative materials comprise oxides.

5. The method of claim 4 wherein the oxides are the same composition.

6. The method of claim 4 wherein the oxides are not of the same composition.

7. The method of claim 1 wherein the conductive structure is a conductive line.

8. The method of claim 1 wherein the conductive structure is a conductive pillar.

9. The method of claim 1 further comprising at least partially filling the contact opening with conductive material.

10. The method of claim 1 wherein the contact opening etching exposes the sidewall etch stop.

11. The method of claim 1 wherein the anisotropic etching is conducted without any patterned masking layer being received over the second insulative material during the anisotropic etching.

12. A method of forming a conductive contact to a conductive structure, comprising:

forming a conductive structure projecting outwardly from a substrate;

providing a first insulative material over the substrate and proximate the structure;

removing a portion of the first insulative material effective to expose opposing sidewall portions of conductive material of the conductive structure, and leave the conductive material of the conductive structure projecting outwardly from the first insulative material;

depositing a second insulative material over the first insulative material and the conductive material of the conductive structure projecting outwardly therefrom, the second insulative material being different in composition from the first insulative material;

anisotropically etching the second insulative material effective to form a sidewall etch stop over a sidewall of the conductive material of the conductive structure;

depositing a third insulative material over the conductive structure and the sidewall etch stop, the third insulative material being different in composition from the second insulative material; and etching a contact opening through the third insulative material to the conductive material of the conductive structure using an etch chemistry which is substantially selective to the second insulative material of the sidewall etch stop.

13. The method of claim 12 wherein the removing comprises chemical etching.

14. The method of claim 12 wherein the second insulative material contacts the conductive sidewall portions.

15. The method of claim 12 wherein the anisotropically etching forms the sidewall etch stop in the form of an insulative collar which surrounds that portion of the conductive material of the conductive structure projecting from the first insulative material.

16. The method of claim 12 wherein the conductive structure comprises a conductive line, and the anisotropically etching forms the sidewall etch stop in the form of a pair of etch stop spacers on opposing sides of the conductive material of the conductive line.

17. The method of claim 12 wherein the contact opening etching exposes the sidewall etch stop.

18. The method of claim 12 wherein the anisotropic etching is conducted without any patterned masking layer being received over the second insulative material during the anisotropic etching.

19. A method of forming a conductive contact to a conductive structure, comprising:

forming a trough in a first insulative material into a desired conductive line shape;

at least partially filling the trough with conductive material effective to form a conductive line therewithin;

removing only some of the first insulative material effective to expose sidewall portions of the conductive material of the conductive line;

depositing a second insulative material over the conductive line exposed sidewall portions, the second insulative material being different in composition from the first insulative material;

anisotropically etching the second insulative material effective to form a sidewall etch stop spacer on a sidewall of the conductive material of the conductive line;

depositing a third insulative material over the conductive line and the sidewall etch stop spacer, the third insulative material being different in composition from the second insulative material; and etching a contact opening through the third insulative material to the conductive material of the conductive line using an etch chemistry which is substantially selective to the second insulative material of the sidewall etch stop spacer.

20. The method of claim 19 wherein the second insulative material contacts the conductive sidewall portions.

21. The method of claim 19 wherein the first and third insulative materials are of the same composition.

22. The method of claim 19 wherein the first and third insulative materials are not of the same composition.

23. The method of claim 19 wherein the second insulative material comprises a nitride, and the first and third insulative materials comprise oxides.

24. The method of claim 19 wherein the contact opening etching exposes the sidewall etch stop spacer.

25. The method of claim 19 wherein the anisotropic etching is conducted without any patterned masking layer being received over the second insulative material during the anisotropic etching.

26. A method of forming a conductive contact to a conductive structure, comprising:

forming a conductive pillar projecting outwardly from a diffusion region of a semiconductor substrate, conductive material of the conductive pillar including an outer region lateral portions of which are surrounded by a first insulative material;

removing only some of the first insulative material effective to expose sidewall portions of the outer region of the conductive material of the conductive pillar;

depositing a second insulative material over the exposed sidewall portions of the conductive pillar, the second insulative material being different in composition from the first insulative material;

anisotropically etching the second insulative material effective to form a sidewall etch stop collar about the conductive material of the conductive pillar;

depositing a third insulative material over the conductive pillar and the sidewall etch stop collar, the third insulative material being different in composition from the second insulative material; and etching a contact opening through the third insulative material to the conductive material of the conductive pillar using an etch chemistry which is substantially selective to the second insulative material of the sidewall etch stop collar.

27. The method of claim 26 wherein the second insulative material contacts the conductive sidewall portions.

28. The method of claim 26 wherein the removing comprises chemical etching.

29. The method of claim 26 wherein the first and third insulative materials are of the same composition.

30. The method of claim 26 wherein the first and third insulative materials are not of the same composition.

31. The method of claim 26 wherein the second insulative material comprises a nitride, and the first and third insulative materials comprise oxides.

32. The method of claim 26 wherein the contact opening etching exposes the sidewall etch stop collar.

33. The method of claim 26 wherein the anisotropic etching is conducted without any patterned masking layer being received over the second insulative material during the anisotropic etching.

34. A method of forming conductive contacts to conductive structures, comprising:

forming a plurality of conductive structures received within and projecting outwardly from a first insulative material, conductive material of the conductive structures being received within and projecting outwardly from the first insulative material;

depositing a second insulative material over the first insulative material and the conductive material of the conductive structures projecting outwardly therefrom, the second insulative material being different in composition from the first insulative material;

anisotropically etching the second insulative material effective to form a plurality of isolated etch stop collars received about the conductive material of the conductive structures;

depositing a third insulative material over the conductive structures and etch stop collars, the third insulative material being different in composition from the second insulative material; and etching contact openings through the third insulative material to the conductive material of the conductive structures using an etch chemistry which is substantially selective to the second insulative material of the etch stop collars.

35. The method of claim 34 wherein at least some of the isolated etch stop collars are formed to collar multiple conductive structures projecting outwardly from the first insulative material.

36. The method of claim 34 wherein the conductive structures comprise conductive pillars.

37. The method of claim 34 wherein the conductive structures comprise conductive pillars projecting from diffusion regions formed within semiconductive material of a bulk semiconductive substrate.

38. The method of claim 34 wherein the first and third insulative materials are of the same composition.

39. The method of claim 34 wherein the first and third insulative materials are not of the same composition.

40. The method of claim 34 wherein the second insulative material comprises a nitride, and the first and third insulative materials comprise oxides.

41. The method of claim 34 wherein the contact openings etching exposes at least some of the sidewall etch stop collars.

42. The method of claim 34 wherein the anisotropic etching is conducted without any patterned masking layer being received over the second insulative material during the anisotropic etching.

* * * * *

UNITED STATES PATENT AND TRADEMARK OFFICE
CERTIFICATE OF CORRECTION

PATENT NO. : 6,645,846 B2
DATED : November 11, 2003
INVENTOR(S) : John M. Drynan et al.

It is certified that error appears in the above-identified patent and that said Letters Patent is hereby corrected as shown below:

Column 4,
Line 12, replace "removing is preferable conducted by chemical etching. Such" with
-- removing is preferably conducted by chemical etching. Such --
Line 51, replace "preferable conducted without providing any masking over" with
-- preferably conducted without providing any masking over --

Signed and Sealed this

Sixteenth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,645,846 B2
DATED : November 11, 2003
INVENTOR(S) : John M. Drynan et al.

It is certified that error appears in the above-identified patent and that said Letters Patent is hereby corrected as shown below:

Column 3,
Line 23, replace "form" with -- formed --.

Column 4,
Line 52, replace "substrate 10" with -- substrate 12 --.

Column 5,
Line 50, replace "insulative" with -- conductive --.

Signed and Sealed this

Twenty-seventh Day of December, 2005

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,645,846 B2 | Page 1 of 1 |
| APPLICATION NO. | : 09/999513 | |
| DATED | : November 11, 2003 | |
| INVENTOR(S) | : John M. Drynan et al. | |

It is certified that error appears in the above-identified patent and that said Letters Patent is hereby corrected as shown below:

Col. 3, line 21:
  Replace "semiconductor wafer fragment 10 comprising of bulk"
  With --semiconductor wafer fragment 10 comprised of bulk--

Signed and Sealed this

Fifth Day of June, 2007

JON W. DUDAS
*Director of the United States Patent and Trademark Office*